(12) United States Patent
Namkung

(10) Patent No.: US 12,212,828 B2
(45) Date of Patent: Jan. 28, 2025

(54) ELECTRICAL CHARGE DISCHARGING PATTERN AND ELECTRONIC DEVICE INCLUDING THE SAME

(71) Applicant: Samsung Display Co., Ltd., Yongin-si (KR)

(72) Inventor: Jun Namkung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/507,228

(22) Filed: Nov. 13, 2023

(65) Prior Publication Data
US 2024/0163536 A1 May 16, 2024

(30) Foreign Application Priority Data
Nov. 14, 2022 (KR) .................. 10-2022-0151399

(51) Int. Cl.
*H04N 23/52* (2023.01)
*H04M 1/02* (2006.01)
*H04N 23/51* (2023.01)
*H10K 59/65* (2023.01)

(52) U.S. Cl.
CPC .......... *H04N 23/52* (2023.01); *H04M 1/0264* (2013.01); *H04M 1/0266* (2013.01); *H04N 23/51* (2023.01); *H10K 59/65* (2023.02)

(58) Field of Classification Search
CPC .... H10K 59/60; H10K 59/65; H10K 59/8722; H04M 1/0264–0268; H04N 23/51; H04N 23/52
See application file for complete search history.

(56) References Cited

U.S. PATENT DOCUMENTS

2023/0217703 A1* 7/2023 Lee .................. H10K 50/80
257/680

FOREIGN PATENT DOCUMENTS

| CN | 109445171 | A | | 3/2019 | |
|---|---|---|---|---|---|
| CN | 114094028 | A | * | 2/2022 | |
| CN | 117935677 | A | * | 4/2024 | ........... H10K 59/873 |
| KR | 20240083005 | A | * | 6/2024 | |

* cited by examiner

*Primary Examiner* — Mariceli Santiago
(74) *Attorney, Agent, or Firm* — CANTOR COLBURN LLP

(57) ABSTRACT

An electronic device includes an electro-optical module which outputs or receives a signal from, an electronic panel including an inner surface defining a panel hole which corresponds to the electro-optical module and has a center, a window on the electronic panel and including a covering member extended across the panel hole, and a flow-blocking layer between the covering member and the electronic panel and overlapping the inner surface of the electronic panel, the flow-blocking layer defining a base part extended from the covering member and toward the electronic panel and defining a first lower surface, and a flow-blocking pattern between the center and the inner surface, the flow-blocking pattern defining a second lower surface forming a step with the first lower surface, and an electrical charge-discharging pattern overlapping the flow-blocking pattern and extending along the inner surface of the electronic panel.

20 Claims, 9 Drawing Sheets

ELECTRICAL CHARGE DISCHARGING PATTERN AND ELECTRONIC DEVICE INCLUDING THE SAME

This application claims priority to Korean Patent Application No. 10-2022-0151399, filed on Nov. 14, 2022, and all the benefits accruing therefrom under 35 U.S.C. § 119, the entire contents of which are hereby incorporated by reference.

BACKGROUND

(1) Field

The present disclosure herein relates to an electronic device, and more particularly, to an electronic device with improved reliability and aesthetics.

(2) Description of the Related Art

Portable electronic devices have been widely used, and the functions thereof become increasingly diverse. Users of such portable devices prefer an electronic device having a larger display region and a narrower non-display region.

An electronic device may include various electronic components such as a display panel that displays images, a window which covers the display panel, an input sensor that detects external inputs, and an electro-optical module. Such electronic components may be electrically connected to each other by signal lines. An electro-optical module may include a camera, an infrared sensor, a proximity sensor, or the like.

SUMMARY

An electro-optical module such as a camera, an infrared sensor, a proximity sensor, or the like may be disposed under a display panel and an input sensor of an electronic device. A hole may be provided in the display panel and the input sensor in order to expose such an electro-optical module to outside the display panel and/or the image sensor. In the hole, a black matrix for dividing regions may be provided. However, when an induced charge is generated due to friction on a surface of a window of the electronic device, a bright spot may occur at the border of the hole provided in a layer such as the display panel and the input sensor.

The present disclosure provides an electronic device with improved product reliability by preventing visibility defects.

An embodiment of the invention provides an electronic device including an electro-optical module that outputs or receives a signal, an electronic panel in which a panel hole overlapping the electro-optical module is defined, a window disposed on the electronic panel, and including a covering member and a print pattern which is disposed under the covering member and a portion of which overlaps an inner surface of the panel hole, and an ink pattern overlapping the print pattern on a plane, and covering at least a portion of the inner surface of the panel hole, wherein the print pattern includes a base part disposed under the covering member, and having a first lower surface, and a blocking pattern disposed under the covering member and disposed between the center of the panel hole and the inner surface of the panel hole, and including a second lower surface having a step from the first lower surface of the base part.

In an embodiment, the blocking pattern may be disposed on the base part, and protrude in a direction away from the base part.

In an embodiment, the second lower surface of the blocking pattern may be recessed in a direction approaching the covering member from the first lower surface of the base part.

In an embodiment, the blocking pattern may have, on a plane, a shape of a closed line encircling the center of the panel hole.

In an embodiment, the print pattern may overlap an edge of the electro-optical module.

In an embodiment, the electronic panel may include a display region and a non-display region adjacent to the display region, and the panel hole is defined to overlap the display region and to be spaced apart from the non-display region on a plane.

In an embodiment, the window may further include an outer print pattern disposed under the covering member and overlapping the non-display region.

In an embodiment, the outer print pattern may include a flat lower surface parallel to a lower surface of the covering member.

In an embodiment, the outer print pattern may include an outer base part disposed under the covering member, and including a third lower surface, and an outer blocking pattern disposed under the covering member, and including a fourth lower surface having a step from the third lower surface of the outer base part.

In an embodiment, the first lower surface of the base part may have a higher surface roughness than a lower surface of the outer print pattern.

In an embodiment, the first lower surface may include a first sub-lower surface and a second sub-lower surface different from each other in surface roughness.

In an embodiment, the ink pattern may include a conductive ink.

In an embodiment, the electronic panel may include a display panel which displays an image, and an upper member disposed on the display panel, and the panel hole may include a first panel hole defined in the display panel, and a second panel hole defined in the upper member.

In an embodiment, the ink pattern may cover at least a portion of an inner surface of each of the first panel hole and the second panel hole.

In an embodiment, the ink pattern may be disposed between the blocking pattern and the inner surface of the panel hole.

In an embodiment, the blocking pattern may include a first blocking pattern disposed between the center of the panel hole and the inner surface of the panel hole, and a second blocking pattern disposed between the first blocking pattern and the center of the panel hole.

In an embodiment of the invention, an electronic device includes an electro-optical module that outputs or receives a signal, an electronic panel in which a panel hole overlapping the electro-optical module is defined, a window disposed on the electronic panel, and including a covering member and a print pattern which is disposed under the covering member and a portion of which overlaps an inner surface of the panel hole, and an ink pattern covering at least a portion of the inner surface of the panel hole, and including a conductive ink. The print pattern includes a base part disposed under the covering member, and a blocking pattern disposed under the covering member, and disposed between the center of the panel hole and the inner surface of the panel hole, the blocking pattern protrudes under the covering member, and has a shape of a closed line encircling the center of the panel hole on a plane, and the ink pattern is in contact with the base part and the blocking pattern.

In an embodiment, the ink pattern may be disposed between the blocking pattern and the inner surface of the panel hole.

In an embodiment of the invention, an electronic device includes an electro-optical module that outputs or receives a signal, an electronic panel in which a panel hole overlapping the electro-optical module is defined, a window disposed on the electronic panel, and including a covering member and a print pattern which is disposed under the covering member and a portion of which overlaps an inner surface of the panel hole, and an ink pattern overlapping the print pattern on a plane, and covering at least a portion of the inner surface of the panel hole. The print pattern includes a base part disposed under the covering member, and a blocking pattern disposed under the covering member and disposed between the center of the panel hole and the inner surface of the panel hole, and the ink pattern is disposed between the blocking pattern and the inner surface of the panel hole.

In an embodiment, the ink pattern may be in contact with the inner surface of the panel hole, a lower surface of the base part, and the blocking pattern.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain the invention. In the drawings.

DETAILED DESCRIPTION

Figure 1:
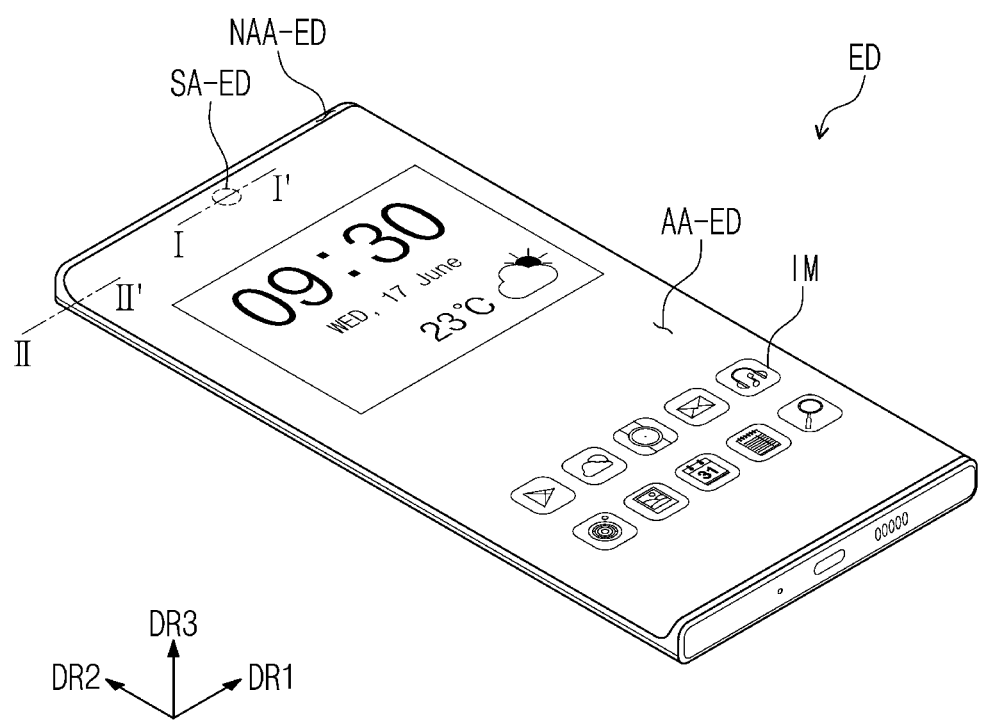
FIG. 1 is a perspective view of an electronic device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (or a region, a layer, a portion, or the like) is referred to as being related to another element such as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents.

As used herein, the term "and/or" includes any and all combinations of one or more of the associated listed items. "At least one" is not to be construed as limiting "a" or "an." "Or" means "and/or."

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the invention. Similarly, a second element, component, region, layer or section may be termed a first element, component, region, layer or section.

The terminology used herein is for the purpose of describing particular embodiments only and is not intended to be limiting. As used herein, the singular forms, "a", "an" and "the" are intended to include the plural forms as well, unless the context clearly indicates otherwise. Within the Figures and the text of the disclosure, a reference number indicating a singular form of an element may also be used to reference a plurality of the singular element.

Also, terms of "below", "on lower side", "above", "on upper side", or the like may be used to describe the relationships of the elements illustrated in the drawings. These terms have relative concepts and are described on the basis of the directions indicated in the drawings.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

In this specification, when an element, such as a layer, a film, a region, or a substrate, is referred to as being related to another element such as being "directly on," "directly connected to" or "directly coupled to" another element, there are no intervening elements, such as a layer, a film, a region, or a substrate, present therebetween. For example, when an element is referred to as being "directly on," two layers or members are disposed without an additional member, such as an adhesion member, being used therebetween.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to the accompanying drawings.

Figure 2A:
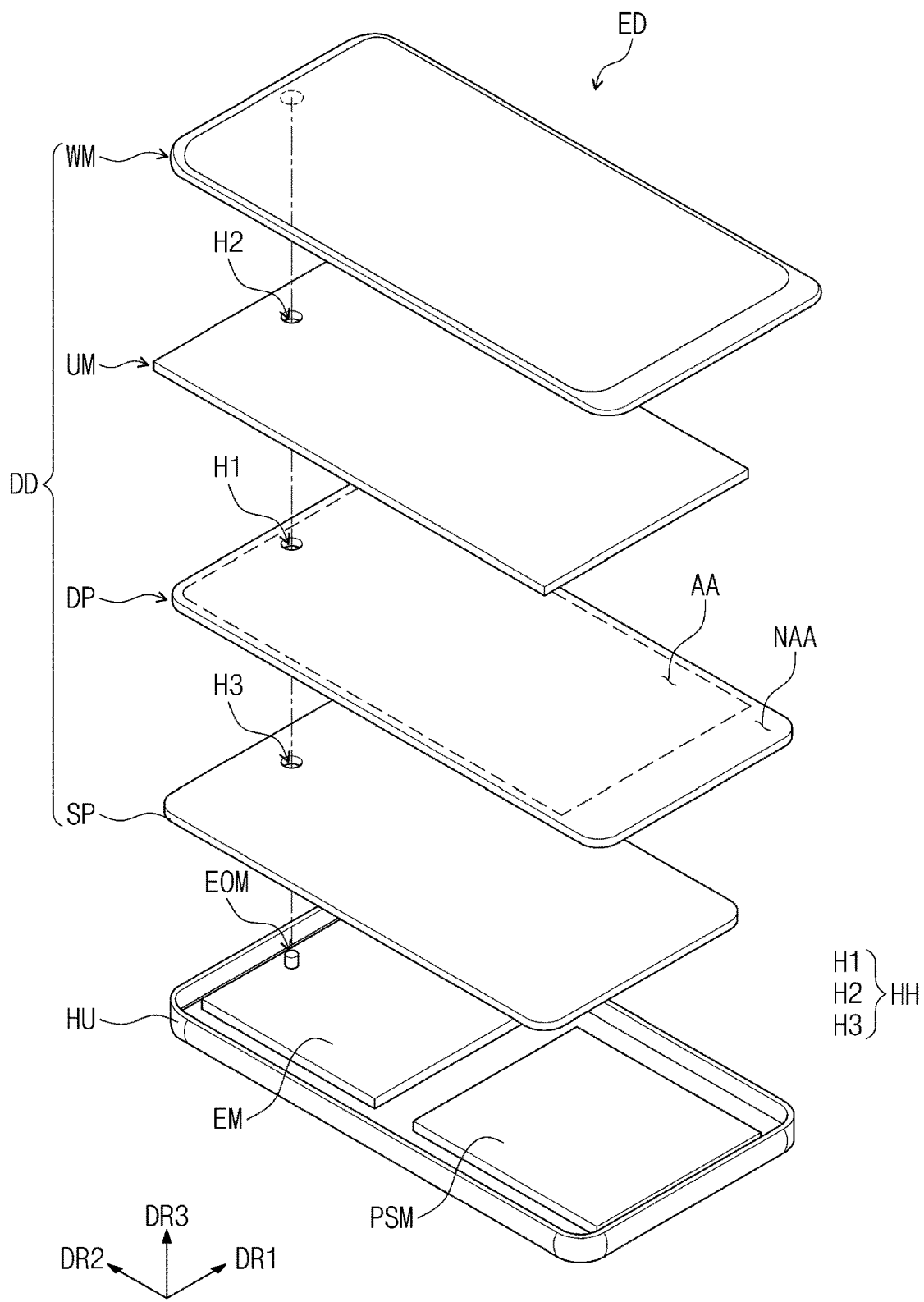
FIG. 2A is an exploded perspective view of an electronic device according to an embodiment of the invention.
Figure 2B:
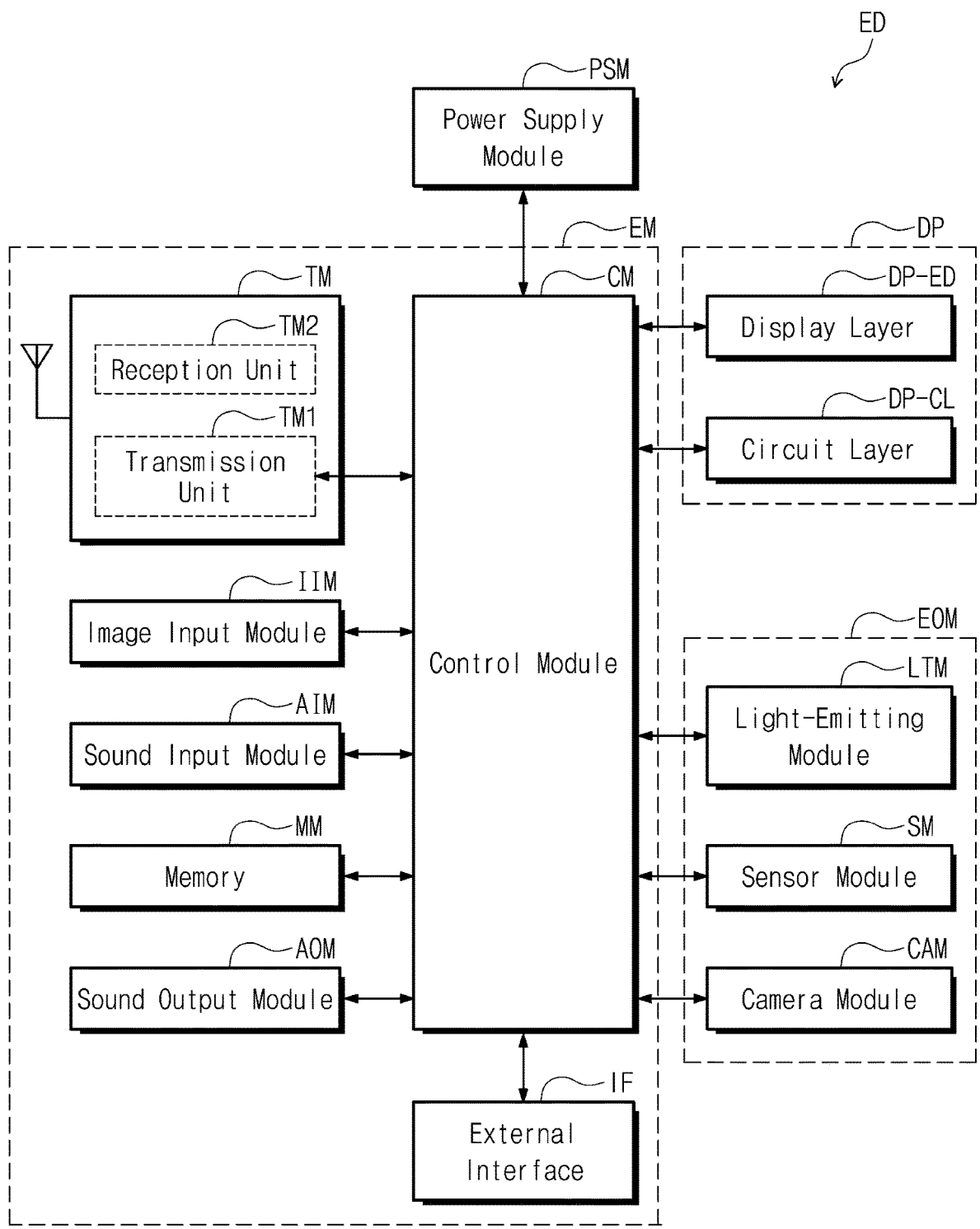
FIG. 2B is a block diagram of an electronic device according to an embodiment of the invention.

FIG. 1 is a perspective view of an electronic device ED according to an embodiment of the invention. FIG. 2A is an exploded perspective view of the electronic device ED according to an embodiment of the invention. FIG. 2B is a block diagram of the electronic device ED according to an embodiment of the invention.

The electronic device ED according to an embodiment may be activated in response to electrical signals. For example, the electronic device ED may be a smartphone, a tablet computer, a car navigation system, a game console, or a wearable device, but an embodiment of the invention is not limited thereto. FIG. 1 exemplarily illustrates a smartphone as the electronic device ED.

The electronic device ED may display an image IM through an active region AA-ED. The active region AA-ED may include a flat surface defined by or parallel to a plane defined by a first direction DR1 and a second direction DR2 which cross each other. The active region AA-ED may further include a curved surface or curved portion bent from at least one side of the flat surface defined by the first direction DR1 and the second direction DR2. FIG. 1 illustrates that the electronic device ED according to an embodiment includes two curved surfaces respectively bent from opposing sides of the flat surface defined by the first direction DR1 and the second direction DR2. However, the shape of the active region AA-ED is not limited thereto. For example, the active region AA-ED may include only the flat surface, or may further include respective curved surfaces bent from at least two or more sides, for example, four sides of the flat surface.

FIG. 1 and the following drawings illustrate first through third directions DR1, DR2, and DR3, and respective directions indicated by the first direction DR1, the second direction DR2, and the third direction DR3 described herein are relative concepts and may thus be changed to other directions.

In this specification, the first direction DR1 and the second direction DR2 may be orthogonal to each other, and the third direction DR3 may be the normal direction of a plane defined by the first direction DR1 and the second direction DR2. throughout this specification and claims, the term "on a plane" may refer to a view of the plane defined by the first direction DR1 and the second direction DR2, and the thickness direction may refer to the third direction DR3 that is the normal direction of the plane defined by the first direction DR1 and the second direction DR2.

A sensing region SA-ED may be defined in the electronic device ED. FIG. 1 illustrates that one sensing region SA-ED is defined. However, the number of sensing regions SA-ED is not limited thereto, and at least two sensing regions SA-ED may be defined. In addition, the sensing region SA-ED may be defined in the active region AA-ED and serve as a portion of the active region AA-ED.

An electro-optical module EOM may overlap the sensing region SA-ED. The electro-optical module EOM may receive an external input transmitted through the sensing region SA-ED from outside the electronic device ED and/or may provide an output through the sensing region SA-ED to the outside of the electronic device ED. For example, a camera module CAM or a sensor module SM to be described later may overlap or correspond the sensing region SA-ED.

The electronic device ED may include an active region AA-ED and a peripheral region NAA-ED which is adjacent to the active region AA-ED. The active region AA-ED may correspond to a display region AA of a display panel DP to be described later, and the peripheral region NAA-ED may correspond to a non-display region NAA of the display panel DP. The active region AA-ED, the display region AA and regions corresponding thereto may be referred to as a display area, while the peripheral region NAA-ED, the non-display region NAA and regions corresponding thereto may be referred to as a non-display area. Such display area and non-display area may refer to areas such as planar areas, defined by dimensions extended along a plane, without being limited thereto.

The peripheral region NAA-ED, which is a region for blocking optical signals, may be disposed outside the active region AA-ED to surround the active region AA-ED. In an embodiment, the peripheral region NAA-ED may be defined on or at a side surface of the electronic device ED, and not on a front surface thereof. The electronic device ED may include at least one curved side surface, and the peripheral region NAA-ED may be defined at the curved side surface.

The electronic device ED according to an embodiment includes a display device DD, a housing HU, and an electro-optical module EOM. The display device DD includes a window WM, an upper member UM, a display panel DP, and a lower member SP.

The display device DD according to an embodiment may include a window WM disposed on the display panel DP, such as facing the display panel DP. The window WM provides or defines an outer surface of the electronic device ED, such as a display surface of the electronic device ED. The window WM may cover a front surface of the display panel DP, and protect the display panel DP from external impacts and scratches. The window WM may be bonded to the upper member UM by a bonding member such as an adhesive layer.

The window WM may include an optically transparent insulating material. For example, the window WM may include a cover glass or synthetic resin film as a covering member. The window WM may have a single-layer or multi-layer structure. For example, the window WM may include a cover glass of a single-layer structure, include a plurality of plastic films bonded to each other such as by an adhesive, or include a cover glass and a plastic film bonded to each other such as by an adhesive. The window WM may further include functional layers such as an anti-fingerprint layer, a phase control layer, and/or a hard coating layer disposed on a transparent substrate.

In the display device DD according to an embodiment, the upper member UM may be disposed under the window WM or disposed above the display module DM, along the thickness direction of the electronic device ED. The upper member UM may include an anti-reflective layer and an input detection sensor. The anti-reflective layer lowers external light reflectance. The input detection sensor detects an external input provided from outside the electronic device ED, such as by a user. The upper member UM may further include an adhesive layer that bonds the anti-reflective layer and the input detection sensor together.

In the display device DD according to an embodiment, the display panel DP may be disposed under the upper member UM. The lower member SP may be disposed under the display panel DP.

The display panel DP may include a display region AA in which an image IM is displayed, and a non-display region NAA adjacent to the display region AA. That is, a front surface of the display panel DP may include both the display region AA and the non-display region NAA. The display region AA may be activated in response to electrical signals, and generate the image IM displayed in the active region AA-ED of the electronic device ED.

The non-display region NAA may be adjacent to the display region AA. The non-display region NAA may surround the display region AA in the plan view. A driving circuit or driving line for driving the display region AA, various signal lines or pads for providing electrical signals to the display region AA, an electronic element, or the like may be disposed in the non-display region NAA.

In the electronic device ED, a through-hole HH may be defined passing through a thickness of at least a part of the components included in the electronic device ED. The through-hole HH may be defined, for example, in the display panel DP, the upper member UM, and the lower member SP. In an embodiment, the through-hole HH may be extended through an entirety of a thickness of one or more of the display panel DP, the upper member UM, and the lower member SP.

The through-hole HH may include one or more holes or openings defined in a respective panel, layer, component, etc. A hole or an opening of the through-hole HH may be an enclosed shape in the plan view, such as being defined by portions of the respective panel, layer or component, without being limited thereto. The enclosed hole or the enclosed opening may be surrounded by a portion of the respective panel, layer or component in the plan view, such as to be spaced apart from an outer edge of such panel, layer or component.

A first panel hole H1 may be defined in the display panel DP at the display region AA thereof. The first panel hole H1 may be formed or provided to overlap the sensing region SA-ED of the electronic device ED. The first panel hole H1 may be formed by passing through a thickness portion of the display panel DP at a location which overlaps or corresponds to the sensing region SA-ED of the electronic device ED. That is, the first panel hole H1 may have a shape passing through the display panel DP from the upper surface to lower surface thereof, such that the first panel hole H1 may be open at both the upper and lower surfaces of the display panel DP, without being limited thereto. The upper surface of the display panel DP may be closest to the upper member UM (or furthest from the lower member SP), while the lower surface of the display panel DP may be closest to the lower member SP (or furthest from the upper member UM).

However, an embodiment of the invention is not limited thereto, and a partial configuration of the display panel DP may not be passed through at the portion where the first panel hole H1 is defined, such that the first panel hole H1 may be open at only one surface among the upper and lower surfaces of the display panel DP. For example, a base layer BL (see FIG. 4) of the display panel DP to be described later may not be passed through at the portion where the first panel hole H1 is defined. In an embodiment, the first panel hole H1 may extend into a partial thickness of the display panel DP (see FIG. 4), up to the base layer BL, such that the base layer BL is exposed to outside the display panel DP at the first panel hole H1. The electro-optical module EOM may be disposed corresponding to a position or location at which the first panel hole H1 is defined.

FIG. 2A exemplarily illustrates that a single first panel hole H1 is defined to overlap the sensing region SA-ED of the electronic device ED. However, the number of the first panel hole H1 is not limited thereto, and more than one first panel hole H1 may be defined in the display panel DP. FIG. 2A exemplarily illustrates that the first panel hole H1 has a circular shape in the plan view (e.g., a planar shape of a circle). However, the shape (e.g., the planar shape) of the first panel hole H1 is not limited thereto, and the first panel hole H1 may be defined to have various shapes according to the electro-optical module EOM.

The area (e.g., the planar area) occupied by the first panel hole H1 on a plane may be smaller than a remaining area of the display region AA. As the first panel hole H1 is defined in the display panel DP, the portion where the first panel hole H1 is defined may have a high transmittance such as a high light transmittance, high signal transmittance, etc. As the electro-optical module EOM is disposed overlapping the first panel hole H1, the performance of the electro-optical module EOM outputting or receiving optical signals may be improved.

The display panel DP may include a display layer DP-ED (see FIG. 4) having an organic light-emitting element, a quantum-dot light-emitting element, a micro-LED light-emitting element, a nano-LED light-emitting element, or the like. The display layer DP-ED (see FIG. 4) may be a component or layer that substantially generates an image IM, generates and/or emits light, etc.

In the upper member UM, a second panel hole H2 may be defined corresponding to the first panel hole H1 of the display panel DP. The second panel hole H2 may be formed to overlap the sensing region SA-ED of the electronic device ED. FIG. 2A exemplarily illustrates that the second panel hole H2 has the same shape and size as the first panel hole H1, where such shape and size are defined along the plane. However, an embodiment of the invention is not limited thereto, and the second panel hole H2 may be different in shape and size from the first panel hole H1.

The second panel hole H2 may have a shape passing through the upper member UM from the upper surface to the lower surface thereof. The second panel hole H2 may be formed to pass through, for example, both of an anti-reflective layer UM-1 (see FIG. 3) and an input sensor UM-2 as an input sensing layer (see FIG. 3) which are each included in the upper member UM. However, an embodiment of the invention is not limited thereto, and the second panel hole H2 may not pass through a partial configuration of the anti-reflective layer UM-1 (see FIG. 3) and the input sensor UM-2 (see FIG. 3) included in the upper member UM, that is, may be extended into a partial thickness of the upper member UM.

In an embodiment, the display panel DP displays an image IM and defines a first panel hole H1, an upper member UM is between the window WM and the display panel DP and defines a second panel hole H1, and the first panel hole H1 and the second panel hole H2 together define the panel hole H-P of the electronic panel EP. In detail, an inner surface of the display panel DP defines the first panel hole H1, an inner surface of the upper member UM defines the second panel hole H2, and the inner surfaces of the display panel DP and the upper member UM respectively define portions of the inner surface of the electronic panel EP.

The lower member SP may be disposed under the display panel DP. The lower member SP may support the display panel DP, absorb impacts applied to the display panel DP, and perform heat dissipation by releasing the heat generated from the components disposed under the display panel DP, for example, an electronic module EM and a power supply module PSM.

In the lower member SP, a third panel hole H3 may be defined corresponding to the first panel hole H1 of the display panel DP. The third panel hole H3 may be formed to overlap the sensing region SA-ED of the electronic device ED. FIG. 2A exemplarily illustrates that the third panel hole H3 has the same shape and size as the first panel hole H1.

However, an embodiment of the invention is not limited thereto, and the third panel hole H3 may have different shape and size from the first panel hole H1.

The third panel hole H3 may have a shape passing through the lower member SP from the upper surface to the lower surface thereof. The third panel hole H3 may be formed to pass through, for example, both of a protective film PF (see FIG. 3) and a functional layer CPL (see FIG. 3) included in the lower member SP. However, an embodiment of the invention is not limited thereto, and the third panel hole H3 may not pass through a partial configuration of the protective film PF (see FIG. 3) and the functional layer CPL (see FIG. 3) included in the lower member SP.

In the electronic device ED according to an embodiment, the electro-optical module EOM may be an electronic component that outputs and/or receives optical signals to provide a function to the electronic device ED. For example, the electro-optical module EOM may include a camera module CAM and a sensor module SM. The camera module CAM may capture external images outside of the electronic device ED by receiving external light through the sensing region SA-ED to provide an image-capture function. In addition, the sensor module SM may be a proximity sensor, an infrared light-emitting sensor, or the like for outputting or receiving external light through the sensing region SA-ED.

An electronic module EM may include a control module, a wireless communication module, an image input module, a sound input module, a sound output module, a memory, an external interface module, and the like. The electronic module EM may include a main circuit board, and the above-mentioned modules may be mounted on the main circuit board, or electrically connected to the main circuit board through a flexible circuit board. The electronic module EM may be electrically connected to a power supply module PSM.

The power supply module PSM may supply power necessary for overall operations of the electronic device ED. For example, the power supply module PSM may include a typical battery device.

Although not illustrated in the drawing, the electronic device ED may include a flexible circuit board electrically connected to the display panel DP, and a main circuit board electrically connected to the display panel DP via connection of the main circuit board to the flexible circuit board. The flexible circuit board may be disposed on the peripheral region NDA of the display panel DP, and coupled to the display panel DP at the peripheral region NDA. The flexible circuit board may be connected to the main circuit board. The main circuit board may be one of the electronic components included in the electronic module EM.

A partial region of the display panel DP which is adjacent to or closest to the flexible circuit board in the peripheral region NDA may be provided as a bending region of the display panel DP. The bending region of the display panel DP may be bendable with respect to a bending axis parallel to the first direction DR1. Through bending of the bending region, the flexible circuit board may overlap a portion of the display panel DP on a plane. In an embodiment, various components or layers of the electronic device ED may include a bending area corresponding to the bending region described above, such that the various components or layers of the electronic device ED are bendable together with the display panel DP.

The electronic device ED according to an embodiment may include a housing HU disposed under the display device DD, the electro-optical module EOM, the electronic module EM, and the power supply module PSM. In the housing HU, the electro-optical module EOM, the power supply module PSM, the electronic module EM, the display panel DP, and the like may be accommodated. In the electronic device ED according to an embodiment, the window WM and the housing HU may be coupled together to form the exterior surface or exterior appearance of the electronic device ED.

Referring to FIG. 2B, the display panel DP may include a display layer DP-ED and a circuit layer DP-CL.

The display layer DP-ED may include one or more component that substantially generates images. The display layer DP-ED may be an emission-type display layer, for example, an organic light-emitting display layer, an inorganic light-emitting display layer, an organic-inorganic light-emitting display layer, a quantum-dot display layer, a micro-LED display layer, or a nano-LED display layer.

The circuit layer DP-CL includes at least one insulation layer, switching or driving element, semi-conductor patterns, and conductive patterns. The insulation layer includes at least one inorganic layer and at least one organic layer. The semi-conductor patterns and the conductive patterns may include signal lines, a pixel driving circuit, and a scan driving circuit.

The power supply module PSM supplies power such as electric power used for overall operations of the electronic device ED. The power supply module PSM may include a typical battery module.

The electronic module EM includes various functional modules for driving the electronic device ED. The electronic module EM may be directly mounted on a motherboard that is electrically connected to the display panel DP, or mounted on a separate substrate and electrically connected to the motherboard through a connector (not shown).

The electronic module EM may include a control module CM, a wireless communication module TM, an image input module IIM, a sound input module AIM, a memory MM, an external interface IF, a sound output module AOM, and the like.

The control module CM controls overall operations of the electronic device ED. The control module CM may be a microprocessor. For example, the control module CM may activate or deactivate the display panel DP. The control module CM may control other modules such as the image input module IIM or the sound input module AIM on the basis of an external input such as a touch signal, a proximity signal, etc. received from the display panel DP.

The wireless communication module TM may communicate with an external electronic device through a first network (for example, a local area network such as a Bluetooth, a WiFi direct, or an infrared data association (IrDA)) or a second network (for example, a long-distance network such as a cellular network, an internet, or a computer network (i.e., LAN or WAN)). Communication modules included in the wireless communication module TM may be integrated into one component (for example, a single chip), or may be provided as a plurality of components (for example, a plurality of chips) that are isolated from each other. The wireless communication module TM may transmit/receive voice signals by using a typical communication line. The wireless communication module TM may include a transmission unit TM1 which modulates signals to be transmitted, and a reception unit TM2 which demodulates signals received.

The image input module IIM processes image signals and converts the image signals to image data displayable on the display panel DP. The sound input module AIM receives external sound signals through a microphone in a recording mode or a voice recognition mode, and converts the sound signals to electrical voice data.

The external interface IF may include a connector capable of physically connecting the electronic device ED to an external electronic device. For example, the external interface IF serves as an interface which is connected to an external charger, wired/wireless data ports, a card (for example, a memory card, and a SIM/UIM card) socket, and the like.

The sound output module AOM converts sound data received from the wireless communication module TM or sound data stored in the memory MM, and outputs the converted data to the outside.

The electro-optical module EOM may receive an external input provided to the electronic device ED, or provide an output to the outside of the electronic device ED. The electro-optical module EOM may include at least one of, for example, a light-emitting module LTM, a sensor module SM, or a camera module CAM.

The light-emitting module LTM generates light, and outputs the light. The light-emitting module LTM may output infrared light. The light-emitting module LTM may include a light emitting diode (LED) element. The sensor module SM may detect infrared light. The sensor module SM may be activated when infrared light with a predetermined level or more is detected. The sensor module SM may include a CMOS sensor. The infrared light generated from the light-emitting module LTM is output, and then reflected by an external subject (for example, a finger or face of a user), and the reflected infrared light may be incident on the sensor module SM.

The camera module CAM may capture a still image and a dynamic image. The camera module CAM may be provided in plurality. Some of the plurality of camera modules CAM may overlap a through-hole HH. An external input (for example, light) may be provided to the camera module CAM through the through-hole HH. For example, the camera module CAM may capture an external image by receiving natural light through the through-hole HH.

Figure 3:
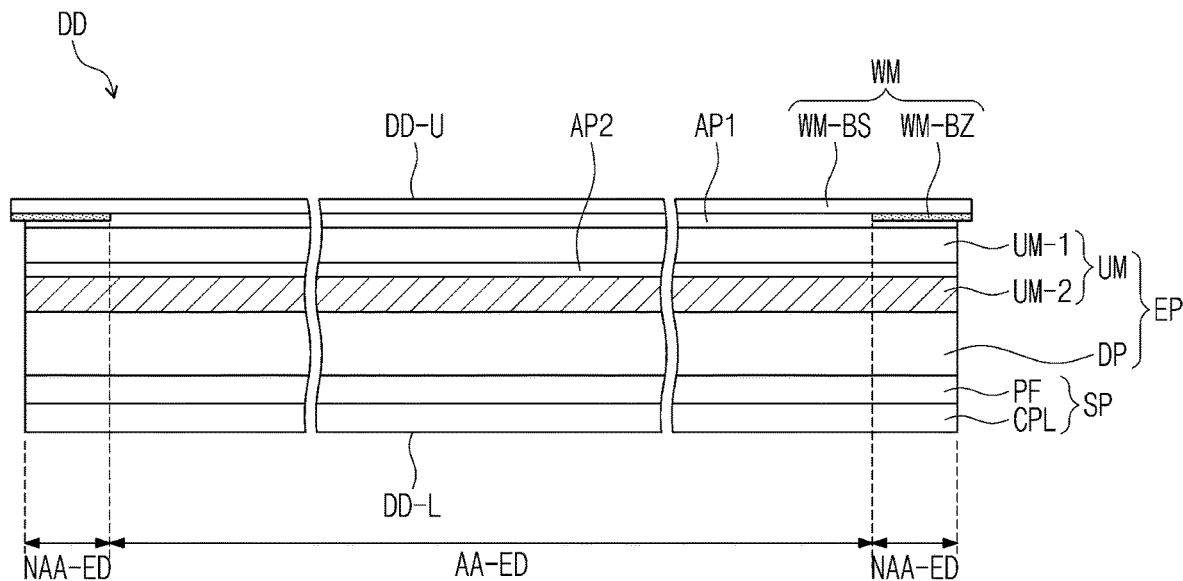
FIG. 3 is a cross-sectional view illustrating a partial configuration of a display device according to an embodiment of the invention.
Figure 3:
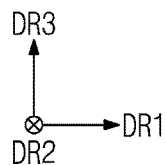

FIG. 3 is a cross-sectional view illustrating a partial configuration of a display device DD according to an embodiment of the invention.

Referring to FIG. 3, the display device DD according to an embodiment of the invention may include a window WM, an upper member UM, a display panel DP, and a lower member SP. The display device DD may include a front surface DD-U, and a rear surface DD-L which is opposite to the front surface DD-U. The front surface DD-U of the display device DD may be defined by a surface of the window WM, and the rear surface DD-L of the display device DD may be defined by a surface of the lower member SP.

In an embodiment, the window WM may cover a front surface of the display panel DP. The window WM may include a covering member WM-BS and an outer print pattern WM-BZ. The covering member WM-BS may include a transparent base layer such as a glass substrate or a transparent film. The outer print pattern WM-BZ may have a multi-layer structure. The multi-layer structure may include a colored layer and a light-blocking layer such as a black light-blocking layer. The colored layer and the black light-blocking layer may be formed or provided on the transparent base layer by a deposition, a printing, or a coating process. The outer print pattern WM-BZ may also be omitted from the window WM, and formed on the upper member UM instead of on the covering member WM-BS.

In an embodiment, the upper member UM includes an anti-reflective layer UM-1 and an input sensor UM-2. As illustrated in FIG. 3, the window WM and the anti-reflective layer UM-1 may be bonded together by a first adhesive layer AP1, and the input sensor UM-2 may be bonded to the anti-reflective layer UM-1 by a second adhesive layer AP2. At least one of the first adhesive layer AP1 or the second adhesive layer AP2 may be omitted. For example, the second adhesive layer AP2 may be omitted, and the anti-reflective layer UM-1 may be directly disposed on the input sensor UM-2. As used herein, elements being directly related such as being directly disposed, may contact each other such as to form an interface therebetween.

The anti-reflective layer UM-1 may lower external light reflectance. The anti-reflective layer UM-1 may include a phase retarder and/or a polarizer. The anti-reflective layer UM-1 may include a polarizing film or color filters. The color filters may have a predetermined arrangement. The arrangement of the color filters may be determined on the basis of the light-emitting colors of pixels included in the display panel DP. The anti-reflective layer UM-1 may further include a partitioning layer adjacent to the color filters.

The input sensor UM-2 may include a plurality of sensing electrodes (not shown) for detecting an external input, trace lines (not shown) connected to the plurality of sensing electrodes, and an inorganic and/or organic layer for insulating/protecting the plurality of sensing electrodes or the trace lines. The input sensor UM-2 may be a capacitive sensor, but an embodiment of the invention is not limited particularly thereto.

The input sensor UM-2 may be directly formed on an encapsulation layer ENL such as a thin-film encapsulation layer of the display panel DP, such as through a continuous process in manufacturing or providing of the display panel DP. However, an embodiment of the invention is not limited thereto, and the input sensor UM-2 may be manufactured as a separate panel or layer, and attached to the display panel DP by an adhesive layer such as being attached to the display panel DP at an uppermost surface thereof.

The lower member SP may include a protective film PF and a functional layer CPL facing the protective film PF. The protective film PF may be disposed under the display panel DP, and the functional layer CPL may be disposed under the protective film PF such as to be further from the display panel than the protective film PF.

The protective film PF may be disposed under the display panel DP, and may thus increase resistance to compressive force caused by external pressure while supporting the display panel DP, thereby increasing resistance of the display panel DP to a force. The protective film PF may include a flexible plastic material such as polyimide or polyethyleneterephthalate. The protective film PF may be a colored film having a low light-transmittance. The protective film PF may be omitted from the lower member SP. When the protective film PF is omitted, the functional layer CPL may be directly disposed under the display panel DP.

The functional layer CPL may be disposed under the protective film PF, absorb impacts applied to the display panel DP, and release heat generated from the components that are disposed under the display panel DP. The functional layer CPL may include, for example, an impact absorption layer and/or a heat dissipation layer. For example, the functional layer CPL may release the heat generated from the electronic module EM (see FIG. 2A) and the power supply module PSM (see FIG. 2A) of the electronic device ED (see FIG. 2A) previously described. The functional layer CPL may also include a metal plate that absorbs impacts applied to the display panel DP and supports the display panel DP.

Figure 4:
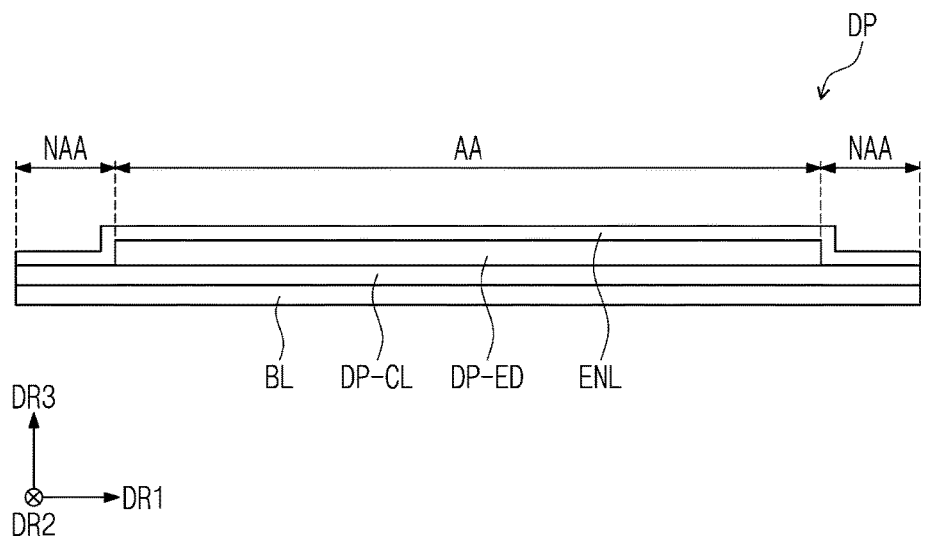
FIG. 4 is a cross-sectional view of a display panel according to an embodiment of the invention.

FIG. 4 is a cross-sectional view of a display panel DP according to an embodiment of the invention.

The display panel DP according to an embodiment includes a base layer BL, a circuit layer DP-CL disposed on the base layer BL, a display layer DP-ED, and an encapsulation layer ENL.

The base layer BL may include a plastic substrate, a glass substrate, a metal substrate, an organic/inorganic composite material substrate, or the like. For example, the base layer BL may include at least one polyimide layer. The aforementioned lower member SP may be disposed under the base layer BL.

The circuit layer DP-CL includes at least one insulation layer, semi-conductor patterns, and conductive patterns. The insulation layer includes at least one inorganic layer and at least one organic layer. The semi-conductor patterns and the conductive patterns may include signal lines, a pixel driving circuit, and a scan driving circuit. In addition, the circuit layer DP-CL may include a back metal layer.

The display layer DP-ED includes a display element, for example, a light-emitting element. For example, the light-emitting element may be an organic light-emitting element, a quantum-dot light-emitting element, a micro-LED light-emitting element, or a nano-LED light-emitting element. The display layer DP-ED may further include an organic layer such as a pixel-defining film.

The display layer DP-ED may be disposed in a display area such as a display region AA. A non-display region NAA may be disposed outside the display region AA to surround the display region AA, and may not have a light-emitting element disposed therein.

The encapsulation layer ENL may be disposed on the display layer DP-ED to cover the display layer DP-ED. The encapsulation layer ENL may be disposed on the circuit layer DP-CL to seal the display layer DP-ED. The encapsulation layer ENL may be a thin-film encapsulation layer including a plurality of organic thin films and inorganic thin films. The encapsulation layer ENL may also include a thin-film encapsulation layer having a stacked structure of inorganic/organic/inorganic layers. The stacked structure of the encapsulation layer ENL is not limited particularly thereto.

Figure 5:
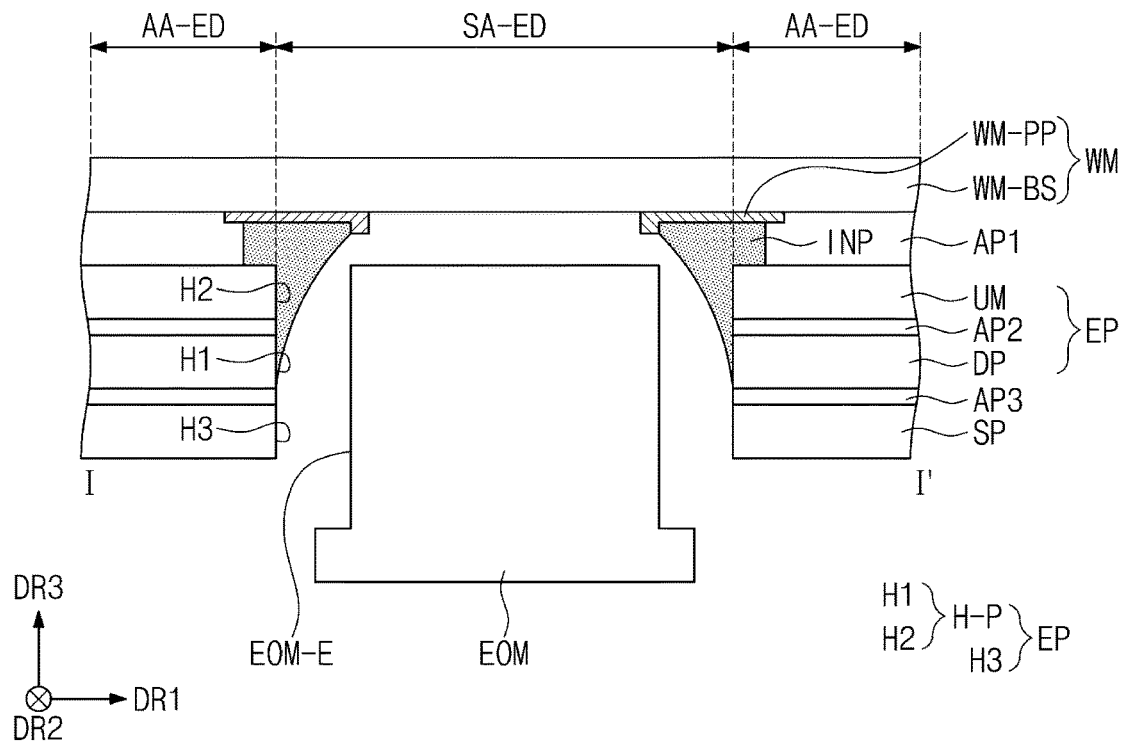
FIG. 5 is an enlarged cross-sectional view illustrating a portion of an electronic device according to an embodiment of the invention.

FIG. 5 is an enlarged cross-sectional view illustrating a portion of an electronic device ED according to an embodiment of the invention. FIG. 5 illustrates a cross-section taken along line I-I' of FIG. 1. FIG. 5 illustrates a cross-section corresponding to the sensing region SA-ED and the active region AA-ED which is adjacent thereto in the electronic device ED of FIG. 1.

Referring to FIGS. 1 and 5 together, the electronic device ED according to an embodiment includes an electronic panel EP, a window WM, an ink pattern INP, and an electro-optical module EOM. The electronic panel EP may include the aforementioned display panel DP and the upper member UM.

The electronic device ED may further include a lower member SP. In addition, the electronic device ED may include a plurality of adhesive layers for bonding the components to each other. In an embodiment, the electronic device ED may include a first adhesive layer AP1 disposed between the window WM and the electronic panel EP, a second adhesive layer AP2 disposed between the display panel DP and the upper member UM, and a third adhesive layer AP3 disposed between the electronic panel EP and the lower member SP. At least one of the first adhesive layer AP1, the second adhesive layer AP2, or the third adhesive layer AP3 may be omitted, such as shown in the configuration of FIG. 3.

In the electronic device ED according to an embodiment, the electro-optical module EOM is disposed corresponding to the sensing region SA-ED. A through-hole HH is defined in the electronic device ED in correspondence to the electro-optical module EOM. The through-hole HH may include a first panel hole H1 defined in the display panel DP, a second panel hole H2 defined in the upper member UM, and a third panel hole H3 defined in the lower member SP. Throughout the specification and the claims, the first panel hole H1 defined in the display panel DP and the second panel hole H2 defined in the upper member UM together may be referred to as "a panel hole H-P." That is, a panel hole H-P is defined in the electronic panel EP of the electronic device ED in correspondence to the sensing region SA-ED. A boundary may be defined between the sensing region SA-ED and the active region AA-ED. An outer boundary of the panel hole H-P may correspond to such boundary, without being limited thereto.

The panel hole H-P may be defined by one or more layer of the electronic device ED. A sidewall of the one or more layer may define the panel hole H-P. The sidewall may be considered an inner surface of the through-hole HH, without being limited thereto. The sidewalls of the layers which define the through-hole HH may be exposed to outside such layers by the through-hole HH. A respective adhesive layer may also include a sidewall which contributes to defining a portion of the through-hole HH.

In the electronic device ED according to an embodiment, the window WM includes a covering member WM-BS as a base substrate and a print pattern WM-PP as a light-blocking pattern.

The covering member WM-BS includes a transparent base layer such as a glass substrate or a transparent film. For example, the covering member WM-BS may include a single-layer glass substrate. Alternatively, the covering member WM-BS may include a plurality of plastic films bonded together by an adhesive, or include a cover glass and a plastic film bonded to each other by an adhesive.

The print pattern WM-PP is disposed under the covering member WM-BS and closer to the display panel DP, and disposed such that a portion of the print pattern WM-PP overlaps an inner surface of the panel hole H-P. That is, the print pattern WM-PP may be disposed to overlap a boundary portion of the electronic panel EP where the panel hole H-P is defined. The print pattern WM-PP may be disposed to overlap an inner surface of the through-hole HH of the electronic device ED. The print pattern WM-PP may be disposed to overlap an edge EOM-E of the electro-optical module EOM. In an embodiment, the electro-optical module EOM extends into the panel hole H-P and has an outer edge (e.g., the edge EOM-E), and the electrical charge-discharging pattern (e.g., the print pattern WM-PP) overlaps the outer edge of the electro-optical module EOM. That is, a portion of the electro-optical module EOM may be blocked by the print pattern WM-PP. Throughout the specification and claims, "inner surfaces" of the panel hole H-P, the through-hole HH, the first through third panel holes H1, H2, or H3, etc., refer to side surfaces or sidewalls indicated by respective reference numerals or symbols of the components, and may be substantially surfaces respectively defining the panel hole H-P, the through-hole HH, or the first through third panel holes H1, H2, or H3, etc.

The print pattern WM-PP includes a base part having a flat lower surface, and a blocking pattern having a lower surface stepped from the lower surface of the base part. The blocking pattern may have a shape protruding from the base part, or a shape that defines a recess from the lower surface of the base part. The shapes of the base part and the blocking pattern included in the print pattern WM-PP will be described later.

The print pattern WM-PP may have a multi-layer structure. The multi-layer structure may include a colored layer and a black light-blocking layer. The colored layer and the black light-blocking layer may be formed by a deposition, a printing, or a coating process.

The ink pattern INP is disposed to overlap a portion of the print pattern WM-PP on a plane. As illustrated in FIG. 5, the ink pattern INP is disposed to cover at least a portion of the inner surface of the panel hole H-P. The ink pattern INP may be disposed to cover, for example, the inner surface of the display panel DP at the first panel hole H1 and the inner surface of the upper member UM at the second panel hole H2. The ink pattern INP may be disposed to cover at least a portion of the inner surface of the first panel hole H1 defined in the display panel DP. FIG. 5 exemplarily illustrates that the ink pattern INP entirely covers the inner surface of the first panel hole H1 and the inner surface of the second panel hole H2 (e.g., covers an entirety of the sidewalls of the display panel DP and the upper member UM). However, an embodiment of the invention is not limited thereto, and the ink pattern INP may also be disposed to cover only a portion of the inner surface of the first panel hole H1 and a portion of the inner surface of the second panel hole H2. Alternatively, the ink pattern INP may be disposed to cover at least a portion of the inner surface of the third panel hole H3 defined in the lower member SP as well.

The ink pattern INP may include a conductive ink such as to define a conductive pattern. The ink pattern INP may include an ink containing a conductive material. For example, the ink pattern INP may include a conductive ink containing graphene. Alternatively, the ink pattern INP may include a conductive ink containing metal powder.

The ink pattern INP includes a conductive ink, and may thus remove an electric field which is formed by induced charges (e.g., electrical charges) generated on a surface of the covering member WM-BS of the window WM, such as to define an electrostatic discharge pattern. The covering member WM-BS of the window WM may include a glass substrate or a plastic film. On the surface of the covering member WM-BS, induced charges may be generated due to friction, and a bright spot may occur due to an electric field formed by the induced charges at the border of the panel hole H-P during an operation of the electronic panel EP. Accordingly, a defect that causes the border or the outer periphery of the panel hole H-P to be brightly viewed to the outside may occur. In the electronic device ED according to an embodiment, since the ink pattern INP including a conductive ink is disposed to cover at least a portion of the inner surface of the panel hole H-P, an electric field formed by induced charges may be removed, thereby preventing the defect that causes occurrence of a bright spot and the border of the panel hole H-P to be brightly viewed to the outside.

Figure 6:
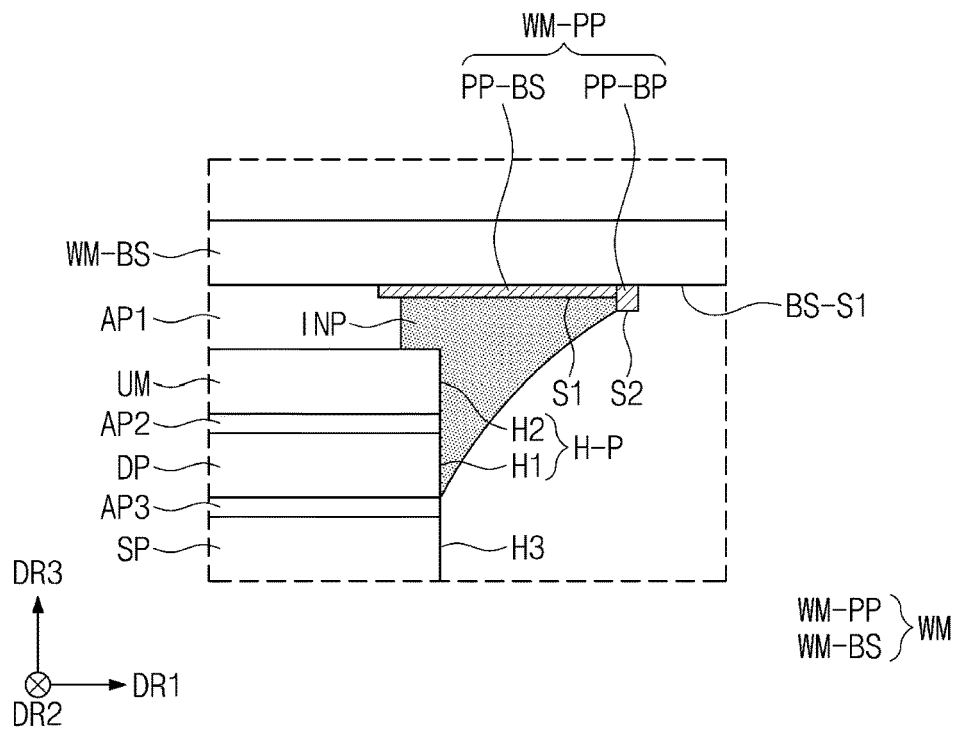
FIG. 6 is an enlarged cross-sectional view illustrating a portion of an electronic device according to an embodiment of the invention.
Figure 7:
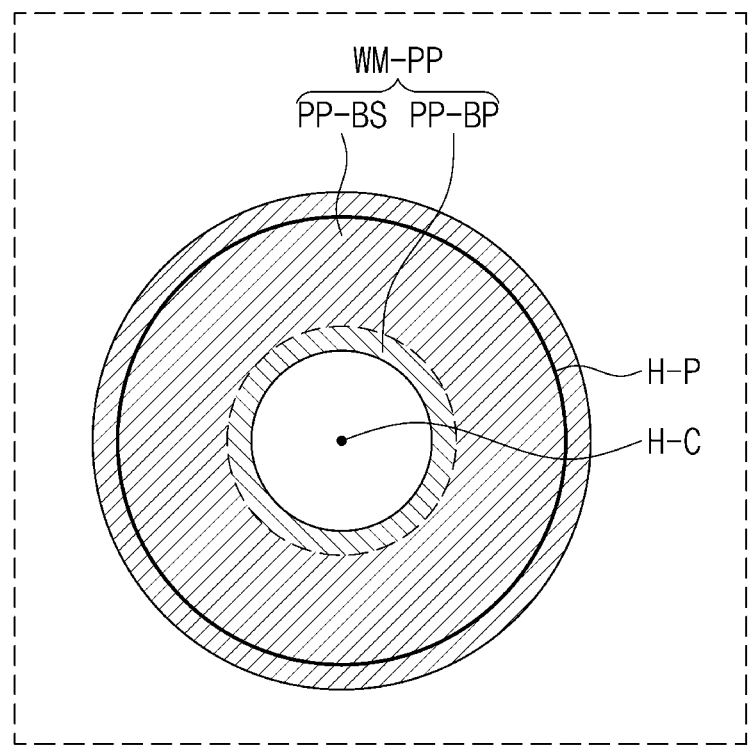
FIG. 7 is an enlarged plan view illustrating a portion of an electronic device according to an embodiment of the invention.
Figure 7:
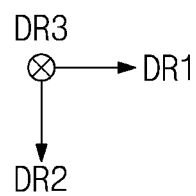

FIG. 6 is an enlarged cross-sectional view illustrating a portion of an electronic device ED according to an embodiment of the invention. FIG. 7 is an enlarged plan view illustrating a portion of an electronic device ED according to an embodiment of the invention. FIG. 7 briefly illustrates the planar shape of a partial configuration, illustrated in FIG. 6. FIGS. 6 and 7 illustrate in more detail the arrangement relationship and the shape of the ink pattern INP and the print pattern WM-PP among the components of the electronic device ED of FIG. 5.

Referring to FIGS. 5 and 6 together, the print pattern WM-PP is disposed under the covering member WM-BS, and includes a base part PP-BS and a blocking pattern PP-BP. A thickness of the blocking pattern PP-BP may be greater than a thickness of the base part PP-BS, such as to form a stepped structure in cross-section.

The base part PP-BS is disposed under the covering member WM-BS, and includes a flat first lower surface S1. The first lower surface S1 may be a flat surface parallel to a lower surface BS-S1 of the covering member WM-BS. The base part PP-BS may overlap the aforementioned inner surface of the panel hole H-P of the print pattern WM-PP.

As illustrated in FIG. 6, the blocking pattern PP-BP is disposed under the covering member WM-BS, and may be disposed at the end of the base part PP-BS. The end of the base part PP-BS may be closest to the through-hole HH. However, an embodiment of the invention is not limited thereto, and the blocking pattern PP-BS may be disposed at a middle portion instead of the end of the base part PP-BS.

Referring to FIG. 7, the blocking pattern PP-BP is disposed between the center H-C of the panel hole H-P, and the inner surface of the panel hole H-P. The blocking pattern PP-BP may have a shape of a closed line or closed loop spaced apart from the center H-C of the panel hole H-P, on a plane. The blocking pattern PP-BP may have a shape of a closed line or a closed loop encircling the center H-C of the panel hole H-P, on a plane. The blocking pattern PP-BP may have a circular shape having an inner edge equally spaced apart from the center H-C of the panel hole H-P on a plane along the circular shape. The blocking pattern PP-BP may be disposed to have a shape of a concentric circle with the same center as the circular shape of the inner surface of the panel hole H-P.

The inner surface which defines the panel hole H-P, may overlap the base part PP-BS of the print pattern WM-PP on a plane, and may be spaced apart from the blocking pattern PP-BP on a plane. In FIG. 7, the base part PP-BS may extend from an outer edge of the blocking pattern PP-BP to an end of the print pattern WM-PP which is furthest from the panel hole H-P.

The solid line labeled as H-P in FIG. 7 corresponds to the inner surfaces or sidewalls of the upper member UM and the display panel DP shown in FIG. 5, for example, such as to define an "inner surface" at the panel hole H-P.

Referring to FIGS. 5 and 6 together again, the blocking pattern PP-BP may be disposed at the end of the base part PP-BS, and may have a cross-sectional shape protruding from the base part PP-BS, or a shape that is recessed from the base part PP-BS in a thickness direction. In other words, the blocking pattern PP-BP may have a second lower surface S2, and the second lower surface S2 may be a surface forming a step with the first lower surface S1. As illustrated in FIG. 6, the second lower surface S2 may be more spaced apart from the lower surface BS-S1 of the covering member WM-BS than the first lower surface S1, to be further from the lower surface BS-S1 of the covering member WM-BS than the first lower surface S1 along a thickness direction of the electronic device ED. That is, in the print pattern WM-PP according to an embodiment, a blocking pattern PP-BP may be a protruded portion of the base part PP-BS.

The ink pattern INP covers at least a portion of the inner surface of the various layers defining the panel hole H-P, and is disposed to overlap the print pattern WM-PP on a plane. The ink pattern INP may entirely overlap the print pattern WM-PP on a plane. An entirety of the ink pattern INP may overlap the print pattern WM-PP. That is, the ink pattern INP may be disposed under the print pattern WM-PP, and the ink pattern INP may not overlap a portion where the print pattern WM-PP is not disposed. Each of the ink pattern INP and the print pattern WM-PP may have an inner edge closest to the center H-C and an outer edge which is furthest from the center H-C. The inner and outer edges of the ink pattern INP may be spaced apart from the inner and outer edges of the print pattern WM-PP as shown in FIGS. 5 and 6, without being limited thereto. In an embodiment the outer edges of the ink pattern INP and the print pattern WM-PP may be aligned with each other. While FIGS. 5 and 6 show a cross-section in the first direction DR1 and the third direction DR3 of the ink pattern INP, it is understood that the cross-section may be extended around the center H-C similar to how the print pattern WM-PP is shown in FIG. 7.

The ink pattern INP may be in contact with the print pattern WM-PP, such as to form an interface therebetween. The ink pattern INP may be in contact with the base part PP-BS and the blocking pattern PP-BP of the print pattern WM-PP. The ink pattern INP may be in contact with the first lower surface S1 of the base part PP-BS. The ink pattern INP may not be in contact with the second lower surface S2 of the blocking pattern PP-BP. As not being in contact, the ink pattern INP may be adjacent to the second lower surface S2 or spaced apart from the second lower surface S2 in a direction along the print pattern WM-PP (or in a direction along the window WM). The ink pattern INP may be in contact with the inner surface of the blocking pattern PP-BP defined at the step. The ink pattern INP may be disposed between the inner surfaces of the layers which define the panel hole H-P, and the blocking pattern PP-BP.

In a process of providing the ink pattern INP, ink material may flow along the print pattern WM-PP. The flow of the ink material for forming the ink pattern INP may be blocked or restricted by the blocking pattern PP-BP having a protruding shape, to prevent overflow of the ink material toward the center H-C of the panel hole H-P in a process of forming the ink pattern INP. The blocking pattern PP-BP may function as a dam to restrict flow of the ink material. The inner surface of the blocking pattern PP-BP as a flow-blocking protrusion together with the inner surfaces of the layers which define the panel hole H-P may guide a position of the ink material for forming the ink pattern INP along the print pattern WM-PP. The blocking pattern PP-BP and the base part PP-BS may together form a flow-blocking pattern.

As previously described, the electronic device ED according to an embodiment includes the ink pattern INP having a conductive ink, and thus prevents a defect that causes a bright spot to be viewed to the outside, and also includes the blocking pattern PP-BP in the print pattern WM-PP in order to prevent the material for forming the ink pattern INP from overflowing to the center H-C of the panel hole H-P. Accordingly, the ink pattern INP may be disposed to overlap only a portion of the window WM where the print pattern WM-PP is disposed. The electronic device ED according to an embodiment may prevent, in a process of forming the ink pattern INP, spreading of a material for forming the ink pattern INP to a portion where the print pattern WM-PP is not disposed, thereby achieving improved aesthetics and reliability.

Figure 8A:
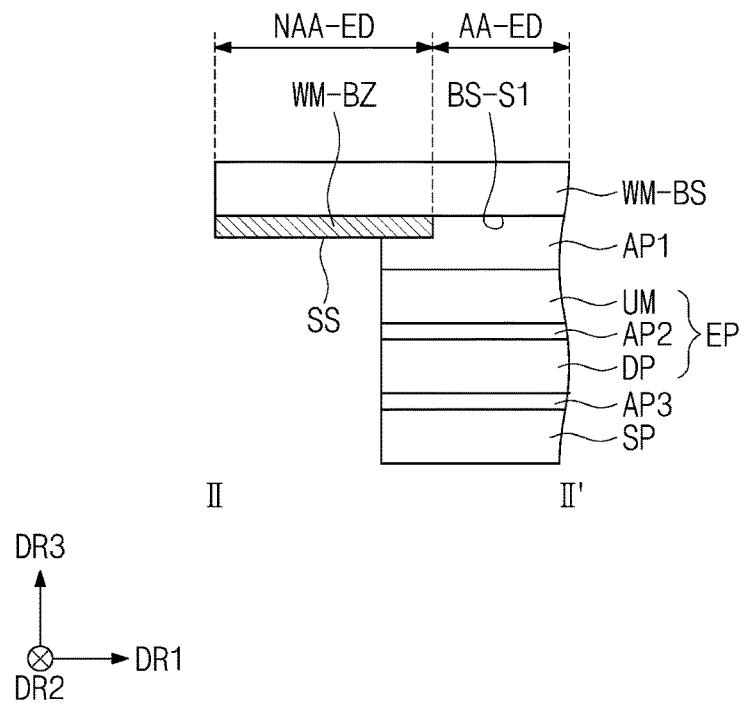
FIGS. 8A and 8B are enlarged cross-sectional views each illustrating a portion of an electronic device according to an embodiment of the invention.
Figure 8B:
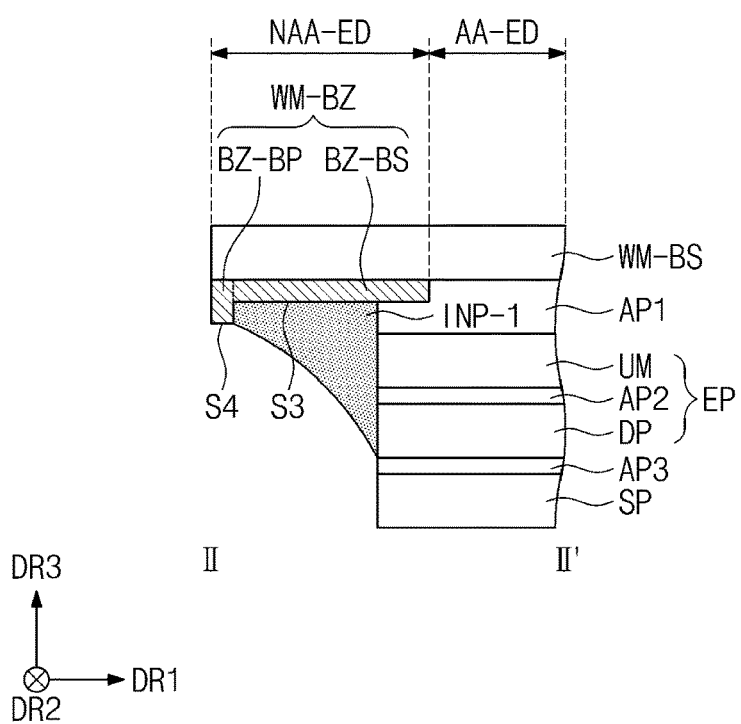

FIGS. 8A and 8B are cross-sectional views each illustrating a portion of an electronic device ED according to an embodiment of the invention. FIGS. 8A and 8B each illustrate an enlarged cross-section taken along line II-IF of FIG. 1. FIGS. 8A and 8B each illustrate an enlarged cross-section corresponding to the peripheral region NAA-ED and the adjacent active region AA-ED of the electronic device ED of FIG. 1. FIGS. 8A and 8B may show an end or end portion of the electronic device ED which is defined by components or layers in the peripheral region NAA-ED.

Referring to FIGS. 5 and 8A together, in the electronic device ED, the window WM may further include an outer print pattern WM-BZ disposed under the covering member WM-BS. The outer print pattern WM-BZ may be a component which is disposed to overlap the peripheral region NAA-ED, and which blocks optical signals and substantially defines the peripheral region NAA-ED.

The outer print pattern WM-BZ may include a flat lower surface SS. That is, the outer print pattern WM-BZ, unlike the print pattern WM-PP overlapping the sensing region SA-ED, may include a flat lower surface SS where a blocking pattern and the like having a step is not formed (e.g., excluding a step_. The lower surface SS of the outer print pattern WM-BZ may be a flat surface parallel to the lower surface BS-S1 of the covering member WM-BS. In the electronic device ED according to an embodiment, a separate ink pattern is not disposed on the peripheral region NAA-ED, and thus the outer print pattern WM-BZ may have the flat lower surface SS without having a separate blocking pattern and the like.

As illustrated in FIG. 8B, an outer print pattern WM-BZ included in an electronic device ED according to another embodiment may include an outer base part BZ-BS and an outer blocking pattern BZ-BP. The outer blocking pattern BZ-BP may include a lower surface having a step extended from the outer base part BZ-BS. The outer base part BZ-BS may include a third lower surface S3 that is a flat surface parallel to the lower surface BS-S1 of the covering member WM-BS, and the outer blocking pattern BZ-BP may include a fourth lower surface S4 forming the step together with the third lower surface S3.

As illustrated in FIG. 8B, the fourth lower surface S4 may be more spaced apart from the lower surface BS-S1 of the covering member WM-BS than the third lower surface S3. That is, in the outer print pattern WM-BZ according to an embodiment, an outer blocking pattern BZ-BP may more protrude than the outer base part BZ-BS. In an embodiment, an outer flow-blocking layer (e.g., the outer print pattern WM-BZ includes an outer base part BZ-BS extended from the covering member WM-BS and toward the electronic panel EP, the outer base part BZ-BS defining a third lower surface S3, and an outer flow-blocking pattern (e.g., the outer blocking pattern BZ-BP) defining a fourth lower surface S4 forming a step with the third lower surface S3 of the outer base part BZ-BS.

An electronic device ED according to another embodiment may further include an outer ink pattern INP-1 overlapping the peripheral region NAA-ED. The outer ink pattern INP-1 may include a conductive ink, and remove induced charges generated due to friction and an electric field formed by the induced charges on a surface of the covering member WM-BS. The outer ink pattern INP-1 may be disposed between one side surface of the electronic panel EP (e.g., an outer surface thereof) and an inner surface of the outer blocking pattern BZ-BP, such that overflowing of the ink material for forming the outer ink pattern INP-1 to the outer edge of the electronic device ED may be blocked.

In an embodiment, the ink pattern INP at the through-hole HH and the outer ink pattern INP-1 at the outer edge of the electronic device ED may be in a same layer as each other. As being in a same layer, elements may be formed in a same process and/or include a same material as each other, elements may be respective portions of a same material layer, elements may be on a same layer by forming an interface with a same underlying or overlying layer, etc., without being limited thereto. Similarly, the print pattern WM-PP and the outer print pattern WM-BZ may be in a same layer as each other.

FIGS. 9A through 9D are cross-sectional views each illustrating a portion of an electronic device ED according to an embodiment of the invention. FIGS. 9A through 9D illustrate enlarged cross-sections corresponding to FIG. 6 each illustrating a portion of an electronic device including a print pattern WM-PP1, WM-PP2, WM-PP3, or WM-PP4 according to an embodiment different from what is illustrated in FIG. 6. Hereinafter, the components same as those previously described will be denoted as the same reference numerals or symbols, and detail descriptions thereof will be omitted.

Figure 9A:
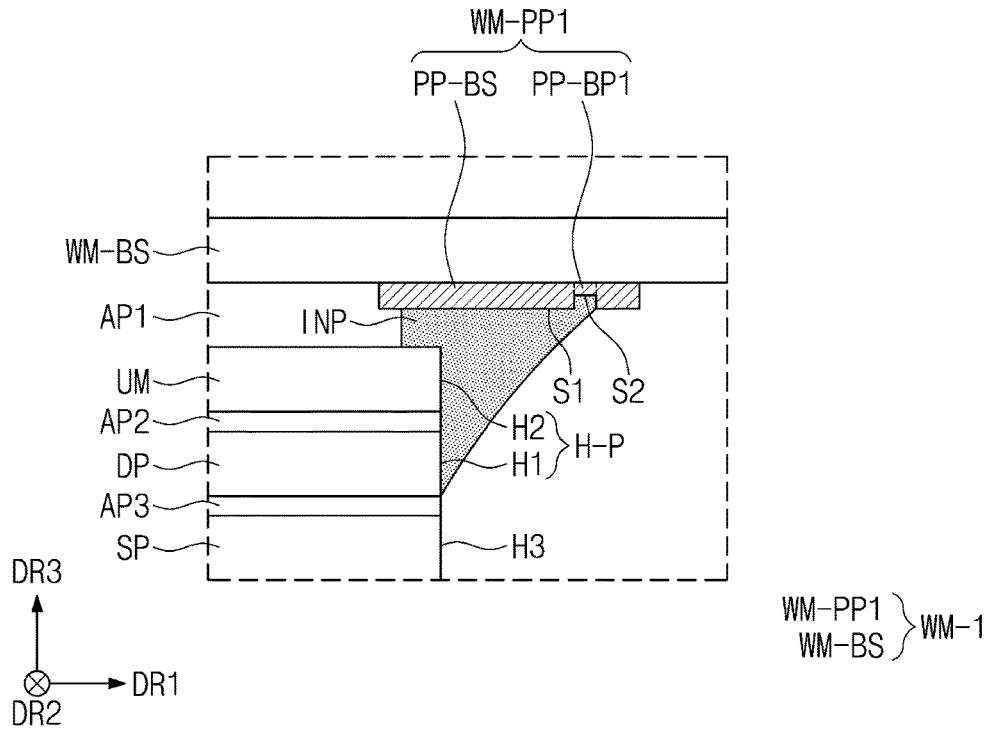
FIGS. 9A through 9D are enlarged cross-sectional views each illustrating a portion of an electronic device according to an embodiment of the invention.

Referring to FIG. 9A, a print pattern WM-PP1 included in a window WM-1 according to an embodiment is disposed under a covering member WM-BS, and includes a base part PP-BS and a blocking pattern PP-BP1. The base part PP-BS is disposed under the covering member WM-BS, and includes a flat first lower surface S1. A recess is defined at the flat first lower surface S1 by spaced apart portions of the base part PP-BS.

As illustrated in FIG. 9A, the blocking pattern PP-BP1 may be disposed at a middle portion of the base part PP-BS, that is, spaced apart from each of opposing ends of the base part PP-BS. The blocking pattern PP-BP1 may be disposed at a middle portion of the base part PP-BS and define a recess. A thickness of the print pattern WM-PP1 at the base part PP-BS is larger than a thickness of the print pattern WM-PP1 at the blocking pattern PP-BP1.

The blocking pattern PP-BP1 may include a second lower surface S2, and the second lower surface S2 may be a surface forming the step together with the first lower surface S1. The second lower surface S2 may be recessed and disposed closer to a lower surface BS-S1 of the covering member WM-BS than the first lower surface S1. That is, the print pattern WM-PP1 according to an embodiment may define a recess as a flow-blocking feature of the window WM-1.

An ink pattern INP covers at least a portion of an inner surface of a panel hole H-P which is defined by one or more sidewall of layers of the electronic device ED, and is disposed to overlap the print pattern WM-PP1 on a plane. The ink pattern INP may entirely overlap the print pattern WM-PP1 on a plane. That is, the ink pattern INP may be disposed under the print pattern WM-PP1, and may not overlap a portion where the print pattern WM-PP1 is not disposed. The ink pattern INP may be in contact with the print pattern WM-PP1. The ink pattern INP may be in contact with the base part PP-BS and the blocking pattern PP-BP1 of the print pattern WM-PP1. The ink pattern INP may be in contact with the first lower surface S1 of the base part PP-BS. The ink pattern INP may also be in contact with the second lower surface S2 of the blocking pattern PP-BP1. The ink pattern INP may also be in contact with the inner surface of the blocking pattern PP-BP1. The ink pattern INP may be disposed between the inner surface of the panel hole H-P and the blocking pattern PP-BP1. When the ink pattern INP is formed, the ink pattern INP may flow into the blocking pattern PP-BP1 having a recessed shape. Thus, in a process of forming the ink pattern INP, it may be possible to prevent material for forming the ink pattern INP from overflowing beyond the portion where the blocking pattern PP-BP1 is disposed and toward the through-hole HH.

Figure 9B:
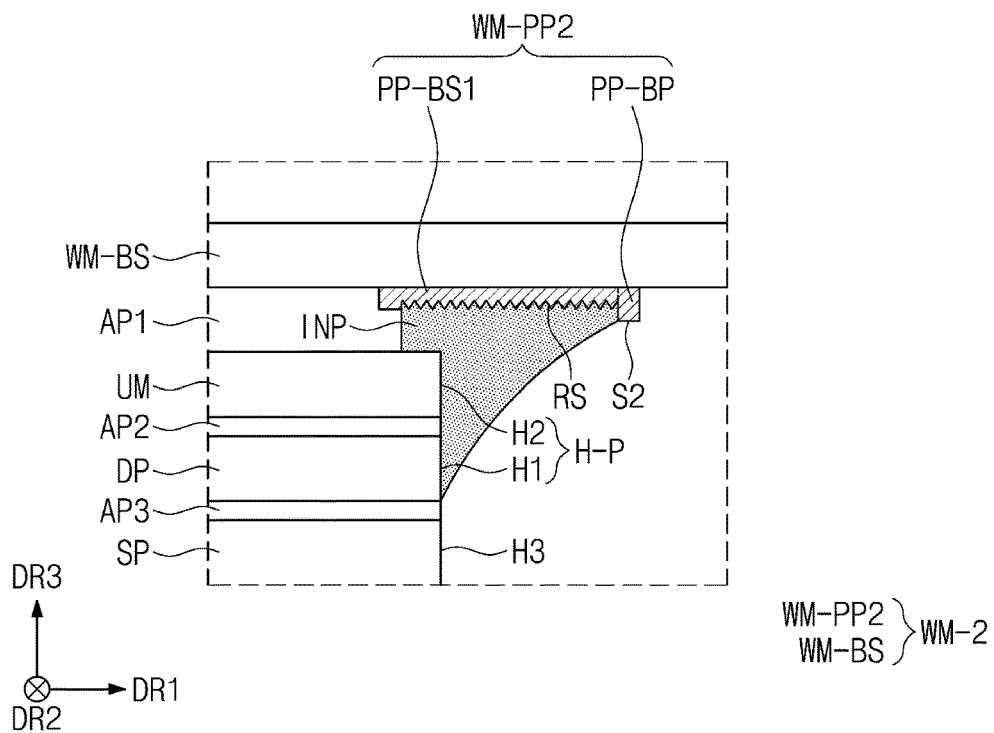

Referring to FIG. 9B, a print pattern WM-PP2 included in a window WM-2 according to an embodiment is disposed under a covering member WM-BS, and includes a base part PP-BS1 and a blocking pattern PP-BP. The blocking pattern PP-BP may be disposed at the end of the base part PP-BS1, and may have a shape protruding from the base part PP-BS1. That is, a second lower surface S2 of the blocking pattern PP-BP may be more spaced apart from a lower surface BS-S1 of the covering member WM-BS than a first lower surface RS of the base part PP-BS1.

As illustrated in FIG. 9B, the first lower surface RS of the base part PP-BS1 may have a high surface roughness such as including concave and convex patterns alternately arranged in a direction from the through-hole HH. In an embodiment, the first lower surface RS of the base part PP-BS1 may have a higher surface roughness than the lower surface SS of the outer print pattern WM-BZ illustrated in FIG. 8A. A plurality of uneven patterns may be formed at the first lower surface RS of the base part PP-BS1, and may thus define a higher surface roughness than the lower surface SS of the outer print pattern WM-BZ.

In embodiments, a first surface roughness area or region corresponding to the uneven patterns may have a surface roughness which is greater than a surface roughness of a second surface roughness area or region excluding the uneven patterns. The first surface roughness area may be disposed further from the center H-C than the second surface roughness area. In an embodiment, the same principle may be applied to the end portion of the electronic device ED (see FIGS. 8A and 8B), except that the first surface roughness area may be disposed closer to an end of the electronic device ED or further from the active region AA-ED.

In the print pattern WM-PP2 included in the window WM-2 according to an embodiment, the first lower surface RS of the base part PP-BS1 may be formed to have a high surface roughness. Thus, an ink pattern INP may be prevented from advancing at a high speed in a process of forming the ink pattern INP, thereby preventing a defect that causes the ink pattern INP to overflow beyond the portion where the print pattern WM-PP is disposed.

Figure 9C:
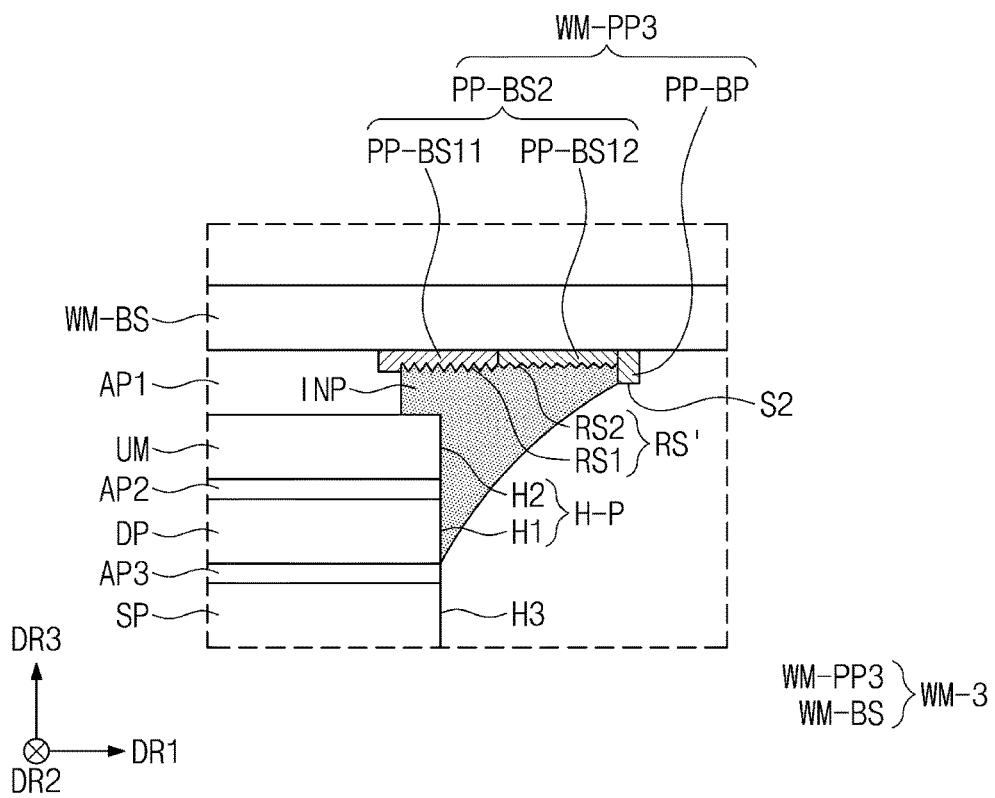

Referring to FIG. 9C, a print pattern WM-PP3 included in a window WM-3 according to an embodiment is disposed under a covering member WM-BS, and includes a base part PP-BS2 and a blocking pattern PP-BP. The blocking pattern PP-BP may be disposed at the end of the base part PP-BS2, and may have a shape protruding from the base part PP-BS2. That is, a second lower surface S2 of the blocking pattern PP-BP may be more spaced apart from a lower surface BS-S1 of the covering member WM-BS than a first lower surface RS' of the base part PP-BS2.

As illustrated in FIG. 9C, the first lower surface RS' of the base part PP-BS2 may include a plurality of surfaces that differ from each other in surface roughness. In an embodiment, the first lower surface RS' of the base part PP-BS2 may include a first surface roughness at a first sub-lower surface RS1 and a second surface roughness at a second sub-lower surface RS2, where the surface roughnesses are different from each other. The first sub-lower surface RS1 and the second sub-lower surface RS2 may be arranged adjacent to each other in a radial direction from the center H-C. The first sub-lower surface RS1 may be more adjacent to an inner surface of a panel hole H-P than the second sub-lower surface RS2, and the second sub-lower surface RS2 may be more adjacent to the center of the panel hole H-P than the first sub-lower surface RS1. The second sub-lower surface RS2 may have a higher surface roughness than the first sub-lower surface RS1. That is, the surface roughness may increase as a distance from the center H-C decreases.

In embodiments, within the base part PP-BS2, a first surface roughness portion PP-BS11 may have a surface roughness which is less than a surface roughness of a second surface roughness portion PP-BS12. The first surface roughness portion PP-BS11 may be disposed further from the center H-C than the second surface roughness portion PP-BS12.

In an embodiment, a plurality of uneven patterns may be formed on each of the first sub-lower surface RS1 and the second sub-lower surface RS2, but the first sub-lower surface RS1 and the second sub-lower surface RS2 may have different uneven patterns in size and shape to define the different surface roughnesses. Unlike what is illustrated in the drawing, either of the first sub-lower surface RS1 or the second sub-lower surface RS2 may not have the uneven patterns. In the print pattern WM-PP3 included in the window WM-3 according to an embodiment, the first lower surface RS' of the base part PP-BS2 may be formed as a plurality of surfaces that differ from each other in surface roughness, thereby effectively controlling the speed of the ink pattern INP flowing in a process of forming the ink pattern INP.

Figure 9D:
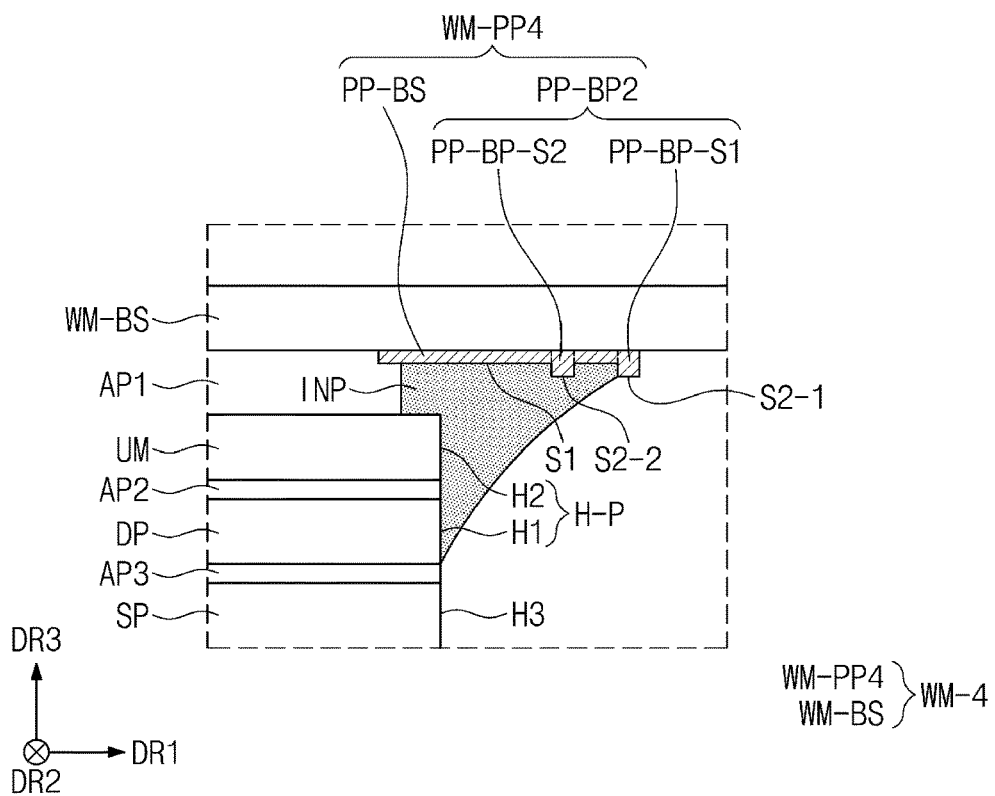

Referring to FIG. 9D, a print pattern WM-PP4 included in a window WM-4 according to an embodiment is disposed under a covering member WM-BS, and includes a base part PP-BS and a blocking pattern PP-BP2. The base part PP-BS may be disposed under the covering member WM-BS, and includes a flat first lower surface S1. The first lower surface S1 may be define at two positions along the radial direction and spaced apart from each other along the radial direction.

As illustrated in FIG. 9D, the blocking pattern PP-BP2 may be provided in plurality as including a plurality of protrusions and a recess defined therebetween along the radial direction. The plurality of blocking patterns PP-BP2 may be respectively disposed at a middle portion or at the end of the base part PP-BS. For example, any one of the blocking patterns PP-BP2 may be disposed at the end of the base part PP-BS, and another may be disposed spaced apart from the one such as being at the middle portion of the base part PP-BS. However, an embodiment of the invention is not limited thereto, and all of the blocking patterns PP-BP2 may be disposed at the middle portion of the base part PP-BS, that is, each spaced apart from the end.

The plurality of blocking patterns PP-BP2 may include a first blocking pattern PP-BP-S1 and a second blocking pattern PP-BP-S2. The first blocking pattern PP-BP-S1 and the second blocking pattern PP-BP-S2 may be spaced apart from each other in one direction, that is, along the radial direction (e.g., the first direction DR1 in FIG. 9D). The first blocking pattern PP-BP-S1 may be more adjacent to (e.g., closer to) the center H-C of a panel hole H-P than the second blocking pattern PP-BP-S2, and the second blocking pattern PP-BP-S2 may be more adjacent to (e.g., closer to) an inner surface of the panel hole H-P than the first blocking pattern PP-BP-S1.

Each of the plurality of blocking patterns PP-BP2 may protrude from a virtual line (or virtual plane) corresponding to the first lower surface S1 of the base part PP-BS, such as to define a recess extended from a second lower surface S2, in a thickness direction. As illustrated in FIG. 9D, the first blocking pattern PP-BP-S1 may include (or define) a (2-1)-th lower surface S2-1, and the second blocking pattern PP-BP-S2 may include (or define) a (2-2)-th lower surface S2-2. The (2-1)-th lower surface S2-1 and the (2-2)-th lower surface S2-2 may each be a surface forming a step with the first lower surface S1. The (2-1)-th lower surface S2-1 and the (2-2)-th lower surface S2-2 may each be a surface more spaced apart from the lower surface BS-S1 of the covering member WM-BS than the first lower surface S1. That is, the print pattern WM-PP4 according to an embodiment may have a first blocking pattern PP-BP-S1 and a second blocking pattern PP-BP-S2 each protruding from a virtual lower surface of the base part PP-BS which corresponds to the first lower surface S1.

Unlike what is illustrated in FIG. 9D, at positions of least one of the first blocking pattern PP-BP-S1 or the second blocking pattern PP-BP-S2 a smaller thickness portion of the print pattern WM-PP4 may be disposed to define a recess (see FIG. 9A, for example). For example, the (2-2)-th lower surface S2-2 of the second blocking pattern PP-BP-S2 may be a surface that is closer to the lower surface BS-S1 of the covering member WM-BS than the first lower surface S1.

An ink pattern INP covers at least a portion of the inner surface of the panel hole H-P, and is disposed to overlap the print pattern WM-PP4 on a plane. The ink pattern INP may entirely overlap the print pattern WM-PP4 on a plane. That is, the ink pattern INP may be disposed under the print pattern WM-PP4, and may not overlap a portion where the print pattern WM-PP4 is not disposed. The ink pattern INP may be in contact with the print pattern WM-PP4. The ink pattern INP may be in contact with the base part PP-BS of the print pattern WM-PP4. The ink pattern INP may be in contact with at least one of the plurality of blocking patterns PP-BP2. The ink pattern INP may be in contact with the first lower surface S1 of the base part PP-BS. The ink pattern INP may be in contact with each of the first blocking pattern PP-BP-S1 and the second blocking pattern PP-BP-S2 included in the plurality of blocking patterns PP-BP2.

Unlike what is illustrated in FIG. 9D, the ink pattern INP may be only in contact with the second blocking pattern PP-BP-S2, and may not be in contact with the first blocking pattern PP-BP-S1. The ink pattern INP may be disposed between the inner surface of the panel hole H-P and any one of the plurality of blocking patterns PP-BP2. As the blocking pattern PP-BP2 is provided in plurality in the electronic device ED according to an embodiment, it may be possible to more effectively prevent, in a process of forming the ink pattern INP, the ink pattern INP from overflowing beyond the portion where the blocking patterns PP-BP2 are disposed.

According to one or more embodiment of the invention, it may be possible to prevent occurrence of a bright spot at the border of a hole provided in a display panel DP, an input sensor, etc. Thus, it may be possible to prevent a defect that causes the border of the hole to be brightly viewed from outside of an electronic device ED. It may also be possible to prevent a conductive ink pattern from overflowing to the outside of a black matrix (e.g., light-blocking pattern). Accordingly, an electronic device ED may have improved aesthetics and product reliability.

In an embodiment, an electronic device ED includes an electro-optical module EOM which outputs a signal to or receives a signal from outside of the electronic device ED, an electronic panel EP including an inner surface defining a panel hole H-P which corresponds to the electro-optical module EOM and has a center H-C, a window WM on the electronic panel EP and including a covering member WM-BS extended across the panel hole H-P (see FIG. 5, for example), and a flow-blocking layer (e.g., the print pattern WM-PP) which is between the covering member WM-BS and the electronic panel EP and overlaps the inner surface of the electronic panel EP. The flow-blocking layer defines a base part PP-BS extended from the covering member WM-BS and toward the electronic panel EP, the base part PP-BS defining a first lower surface S1, and a flow-blocking pattern (e.g., the blocking pattern PP-BP) between the center H-C of the panel hole H-P and the inner surface of the electronic panel EP, the flow-blocking pattern defining a second lower surface S2 forming a step with the first lower surface S1, and an electrical charge-discharging pattern (e.g., the ink pattern INP) overlapping the flow-blocking pattern, the electrical charge-discharging pattern extending along the inner surface of the electronic panel EP.

The flow-blocking pattern may include a protrusion (e.g., blocking pattern PP-BP) of the flow-blocking layer which protrudes from the base part PP-BS and in a direction away from the covering member WM-BS. The second lower surface S2 of the flow-blocking layer is closer to the covering member WM-BS than the first lower surface S1, and the flow-blocking pattern (e.g., PP-BP1 in FIG. 9A) includes a recess defined with the second lower surface S2.

Although the embodiments of the invention have been described, it is understood that the invention should not be limited to these embodiments but various changes and modifications can be made by one ordinary skilled in the art within the spirit and scope of the invention as hereinafter claimed. Therefore, the technical scope of the invention should not be limited to the contents described in the detailed description of the specification, but should be defined by the claims.

What is claimed is:

1. An electronic device comprising:
an electro-optical module which outputs a signal to or receives a signal from outside of the electronic device;
an electronic panel comprising an inner surface defining a panel hole which corresponds to the electro-optical module and has a center;
a window on the electronic panel, the window comprising:
a covering member extended across the panel hole, and
a flow-blocking layer which is between the covering member and the electronic panel and overlaps the inner surface of the electronic panel which defines the panel hole, the flow-blocking layer defining:
a base part extended from the covering member and toward the electronic panel, the base part defining a first lower surface, and
a flow-blocking pattern between the center of the panel hole and the inner surface of the electronic panel, the flow-blocking pattern defining a second lower surface forming a step with the first lower surface of the base part; and
an electrical charge-discharging pattern overlapping the flow-blocking pattern, the electrical charge-discharging pattern extending along the inner surface of the electronic panel.

2. The electronic device of claim 1, wherein the flow-blocking pattern includes a protrusion of the flow-blocking layer which protrudes from the base part and in a direction away from the covering member.

3. The electronic device of claim 1, wherein
the second lower surface of the flow-blocking layer is closer to the covering member than the first lower surface, and
the flow-blocking pattern includes a recess defined with the second lower surface.

4. The electronic device of claim 1, wherein the flow-blocking pattern has a closed loop shape extended around the center of the panel hole.

5. The electronic device of claim 1, wherein
the electro-optical module extends into the panel hole and has an outer edge, and
the electrical charge-discharging pattern overlaps the outer edge of the electro-optical module.

6. The electronic device of claim 1, wherein the electronic panel further comprises:
a display region and a non-display region which is adjacent to the display region in a direction along the window, and
the panel hole defined to overlap the display region and to be spaced apart from the non-display region in the direction along the window.

7. The electronic device of claim 6, wherein
the electronic panel further comprises an end portion in the non-display region, and
the window further comprises an outer flow-blocking layer which is between the covering member and the electronic panel, at the end portion of the electronic panel.

8. The electronic device of claim 7, wherein
the covering member comprises a lower surface closest to the electronic panel, and
the outer flow-blocking layer comprises a flat lower surface parallel to the lower surface of the covering member.

9. The electronic device of claim 7, wherein the outer flow-blocking layer further comprises:
an outer base part extended from the covering member and toward the electronic panel, the outer base part defining a third lower surface, and
an outer flow-blocking pattern defining a fourth lower surface forming a step with the third lower surface of the outer base part.

10. The electronic device of claim 7, wherein the first lower surface of the flow-blocking layer has a higher surface roughness than a lower surface of the outer flow-blocking layer.

11. The electronic device of claim 1, wherein the first lower surface of the flow-blocking layer comprises a first sub-lower surface and a second sub-lower surface having different surface roughnesses from each other.

12. The electronic device of claim 1, wherein the electrical charge-discharging pattern comprises a conductive ink.

13. The electronic device of claim 1, wherein the electronic panel further comprises:
a display panel which displays an image and defines a first panel hole,
an upper member which is between the window and the display panel, the upper member defining a second panel hole, and
the first panel hole and the second panel hole together defining the panel hole of the electronic panel.

14. The electronic device of claim 13, wherein
an inner surface of the display panel defines the first panel hole,
an inner surface of the upper member defines the second panel hole,
the inner surfaces of the display panel and the upper member respectively define portions of the inner surface of the electronic panel, and
the electrical charge-discharging pattern extends along the inner surfaces of the display panel and the upper member.

15. The electronic device of claim 1, wherein the electrical charge-discharging pattern extends between the flow-blocking pattern and the inner surface of the electronic panel which defines the panel hole.

16. The electronic device of claim 1, wherein the flow-blocking pattern comprises:
   a first blocking pattern between the center of the panel hole and the inner surface of the electronic panel; and
   a second blocking pattern between the first blocking pattern and the center of the panel hole.

17. An electronic device comprising:
   an electro-optical module which outputs a signal to or receives a signal from outside of the electronic device;
   an electronic panel comprising an inner surface defining a panel hole which corresponds to the electro-optical module and has a center;
   a window on the electronic panel, the window comprising:
      a covering member extended across the panel hole, and
      a flow-blocking layer which is between the covering member and the electronic panel and overlaps the inner surface of the electronic panel which defines the panel hole, the flow-blocking layer defining:
         a base part extended from the covering member and toward the electronic panel, and
         a flow-blocking pattern between the center of the panel hole and the inner surface of the electronic panel, the flow-blocking pattern having a closed loop shape extended around the center of the panel hole; and
   an electrical charge-discharging pattern extending along the inner surface of the electronic panel,
   wherein the electrical charge-discharging pattern contacts both the base part and the flow-blocking pattern of the flow-blocking layer.

18. The electronic device of claim 17, wherein the electrical charge-discharging pattern extends between the flow-blocking pattern and the inner surface of the electronic panel which defines the panel hole.

19. An electronic device comprising:
   an electro-optical module which outputs a signal to or receives a signal from outside of the electronic device;
   an electronic panel comprising an inner surface defining a panel hole which corresponds to the electro-optical module and has a center;
   a window on the electronic panel, the window comprising:
      a covering member extended across the panel hole, and
      a flow-blocking layer which is between the covering member and the electronic panel and overlaps the inner surface of the electronic panel which defines the panel hole, the flow-blocking layer defining:
         a base part extended from the covering member and toward the electronic panel, and
         a flow-blocking pattern between the center of the panel hole and the inner surface of the electronic panel; and
   an electrical charge-discharging pattern extending along the inner surface of the electronic panel and extending between the flow-blocking pattern and the inner surface.

20. The electronic device of claim 19, wherein the electrical charge-discharging pattern is in contact with the inner surface of the electronic panel together with being in contact with the flow-blocking layer at both the flow-blocking pattern and a lower surface of the base part.

* * * * *